United States Patent [19]
Cronin et al.

[11] Patent Number: 5,926,738
[45] Date of Patent: Jul. 20, 1999

[54] INTERCONNECTS USING METAL SPACERS AND METHOD FOR FORMING SAME

[75] Inventors: John E. Cronin, Milton; Thomas J. Hartswick, Underhill; Anthony K. Stamper, Williston, all of Vt.

[73] Assignee: International Business Machines Corporation, Armonk, N.Y.

[21] Appl. No.: 09/104,074

[22] Filed: Jun. 24, 1998

Related U.S. Application Data

[62] Division of application No. 08/838,371, Apr. 8, 1997, Pat. No. 5,808,364.

[51] Int. Cl.$^6$ .................................................. H01L 23/48
[52] U.S. Cl. ........................ 438/688; 438/688; 438/687; 438/648; 438/669; 438/596; 438/622; 438/625
[58] Field of Search ............................... 438/596, 618, 438/622, 687–688, 637–640, 625–626, 629, 642, 648, 652, 656, 669; 257/347, 903, 758, 763, 765

[56] References Cited

U.S. PATENT DOCUMENTS

| | | |
|---|---|---|
| 5,053,351 | 10/1991 | Fazan et al. ............................... 437/52 |
| 5,061,647 | 10/1991 | Roth et al. ................................ 437/40 |
| 5,146,291 | 9/1992 | Watabe et al. ........................... 257/336 |
| 5,170,243 | 12/1992 | Dhong et al. ............................ 257/304 |
| 5,207,868 | 5/1993 | Shinohara ............................... 156/656 |
| 5,217,570 | 6/1993 | Kadomura ............................... 156/665 |
| 5,221,430 | 6/1993 | Kadomura et al. ..................... 156/665 |
| 5,277,757 | 1/1994 | Sato ........................................ 156/665 |
| 5,291,053 | 3/1994 | Pfiester et al. .......................... 257/393 |
| 5,360,510 | 11/1994 | Kadomura ............................... 156/665 |
| 5,484,747 | 1/1996 | Chien ...................................... 437/190 |
| 5,514,622 | 5/1996 | Bornstein et al. ...................... 437/189 |
| 5,633,781 | 5/1997 | Saenger et al. ...................... 361/321.4 |
| 5,670,806 | 9/1997 | Jun ......................................... 257/306 |

*Primary Examiner*—Charles Bowers
*Assistant Examiner*—Thanh Nguyen
*Attorney, Agent, or Firm*—Schmeiser, Olsen & Watts; Mark F. Chadurjian

[57] ABSTRACT

The preferred embodiment of the present invention provides increased conductivity between interlevel interconnection lines. The preferred embodiment uses sidewall spacers on the sides of the interconnection lines to increase the contact area between interconnection lines and interconnect studs. This increase in area improves connection resistance and allows further device scaling without unacceptable decreases in the conductivity of the connection, and without adding significant expense in the fabrication process.

13 Claims, 5 Drawing Sheets

INTERCONNECTS USING METAL SPACERS AND METHOD FOR FORMING SAME

RELATED APPLICATION

This application is a division of the earlier patent application by Cronin, et al. entitled "Interconnects Using Metal Spacers and Method for Forming Same", Ser. No. 08/838,371, filed Apr. 8, 1997, now U.S. Pat. No. 5,808,364, that is incorporated herein by reference.

BACKGROUND OF THE INVENTION

1. Technical Field

This invention generally relates to semiconductor fabrication, and more specifically relates to interconnects in semiconductor fabrication.

2. Background Art

Modern VLSI semiconductor processing allows for the creation of millions of devices fabricated on a single wafer. To connect these devices, VLSI designs use electrically conductive lines. These interconnection lines are typically on several different layers, generally referred to as metal layer 1, metal layer 2, etc. The interconnection lines are generally connected to other interconnection lines above or below with various types of interlevel interconnection structures, commonly referred to as studs. Several different technologies exist for making these studs. Interconnect studs generally use a separate metal interconnect level to connect layers where other technologies may use tapered vias (i.e., tapered openings in the insulator separating the metal layers to form the connection). Interconnect studs have become popular because their structure has allowed for greater scaling and thus greater device density.

Turning to FIG. 5, a semiconductor portion 800 is illustrated. In the portion 800, a interconnection stud 802 connects between a first connection line 804 and a second connection line 806. The interconnection stud 802 generally consists of a tungsten (W) core 801 with a titanium/titanium nitride (Ti/TiN) liner 808, although other suitable materials are sometimes used.

Ideally, the interconnection stud 802 would be lined up directly with first connection line 804 and second connection line 806. However, mask to wafer misalignments generally introduce some amount of offset between the stud 802 and the connection lines 804 and 806. This is generally acceptable as long as there remains sufficient connection between studs and connection lines.

The first and second connection lines 804 and 806 generally consist of a metal with high conductivity, such as aluminum copper (AlCu), copper (Cu) or another conductor, such as polysilicon. Aluminum copper is generally chosen because of its good conductivity. It is also advantageous because patterning AlCu is relatively easy, i.e., deposit and reactive ion etch (RIE), or otherwise directional etch.

The connection line 804 is generally fabricated by first depositing a blanket of AlCu, followed by a blanket deposition of titanium 810. Photoresist is then applied, exposed and developed, leaving patterns of photoresist on the blanket of titanium and AlCu. Reactive ion etch is then used to etch away the Ti/AlCu everywhere the photoresist is developed away. The reactive ion etch uses chlorine bases ions that chemically react and physically bombard the Ti/AlCu, leaving only the portions of the Ti/AlCu that were covered by photoresist.

One side effect of the reactive ion etch is that a polymer film 814 is formed on the sidewalls of the Ti/AlCu. This is caused by the degrading of the photoresist that occurs during reactive ion etching. The photoresist generally contains carbon, which combines with the atoms in the etch process to form carbonized polymer atoms, which deposit themselves on the sidewalls of the Ti/AlCu. These polymer films 814 (illustrated as dark lines) do not etch, and become a type of sidewall mask. This polymer film has the advantage of the preventing the chlorine gas from isotropically etching into the sides of the near vertical Ti/AlCu metal lines eliminating the possibility of undercuts in the interconnections lines.

Although AlCu has several advantages, it also has the disadvantage of being susceptible to electro-migration. When enough current is applied to AlCu electro-migration can cause voids to be formed in the AlCu line. If these voids are large enough, open circuits can be formed.

This is one reason why the titanium layer 810 is formed above the AlCu connection line 804. The titanium layer serves to hold the line together and provides an alternative current path where voids have caused opens to form in the AlCu line. Titanium has a relatively poor conductivity when compared to AlCu, but it can conduct much more current before it starts to electro-migrate. Thus, the titanium layer 810 increases the life of the AlCu connection line 804.

The connection line 804 is connected to the connection line 806 through interconnect stud 802. Interconnect studs can be used in greater densities than other techniques, such as the use of tapered vias that are filled with metal as part of the next metal layer.

Interconnect studs typically use tungsten as a fill material. Tungsten is used because it can be deposited by using chemical vapor deposition (CVD) into a near vertical hole to form a stud. Other materials, such as AlCu that are deposited by sputtering or evaporation are not used for interconnect studs because of their propensity to create voids when deposited in a hole. After Ti/AlCu connection line 804 is formed, an insulator, such as silicon dioxide ($SiO_2$) or polymide, is blanket deposited and is then planerized by CMP, as shown by line 815. A stud opening or hole is formed in the insulator, exposing an opening to the interconnection line 804, by the technique of applying photoresist, exposing and developing openings in the photoresist, RIE of the insulator, and the removing the unwanted photoresist left in an $O_2$ plasma wash.

Next, the stud 802 is formed by first sputtering a thin titanium/titanium nitride (Ti/TiN) layer 808 into the hole. The Ti/TiN layer 808 is formed to prevent the fluorine of the tungsten CVD process from reacting with the titanium and forming $TiF_3$, a very high resistance material. Next, tungsten is chemical vapor deposited into the hole, filling the hole. A chemical mechanical polish (CMP) is used to polish back the tungsten to be planar.

The second connection line 806 is then formed in the same manner as the first connection line 804. Thus, the first and second connection lines 804 and 806 are connected together with the tungsten interconnect stud 802. Unfortunately, there are disadvantages to this system. In particular, the polymer films 814 act as an insulator. Thus, the only electrical connection between the tungsten stud 802 and the first interconnection line 804 is through the Ti/TiN layer 808 and the top of the titanium layer 810 at region 816.

In the case of misalignment only a portion of the Ti/TiN layer 808 is in contact with a portion of the Ti layer 810 in region 816. Additionally, both Ti and TiN have relatively poor conductivity. This is generally acceptable in the prior art because the layers are relatively thin. However, the low conductivity combined with misalignment will be a problem as the density of semiconductor devices increases and the connection areas become smaller. All of these factors increase the resistance of the connection and will eventually reach a point where there is insufficient conduction between connections.

Thus, what is needed is a method and structure to facilitate interconnection between connection lines and interconnect studs such that sufficiently conductive interconnects are assured as device sizes decrease.

DISCLOSURE OF INVENTION

The preferred embodiment of the present invention provides increased conductivity between interlevel interconnection lines. The preferred embodiment uses sidewall spacers on the sides of the interconnection lines to increase the contact area between interconnection lines and interconnect studs. This increase in area improves connection resistance and allows further device scaling without unacceptable decreases in the conductivity of the connection.

The foregoing and other features and advantages of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements, and.

BEST MODE FOR CARRYING OUT THE INVENTION

The preferred embodiment of the present invention increases the contact area between interconnection lines and interlevel interconnect studs. The preferred embodiment uses sidewall spacers on the sides of the interconnection lines to increase the contact area between interconnection lines and interconnect studs. This increase in area decreases connection resistance and allows an increase in density of the semiconductor devices.

Figure 1:
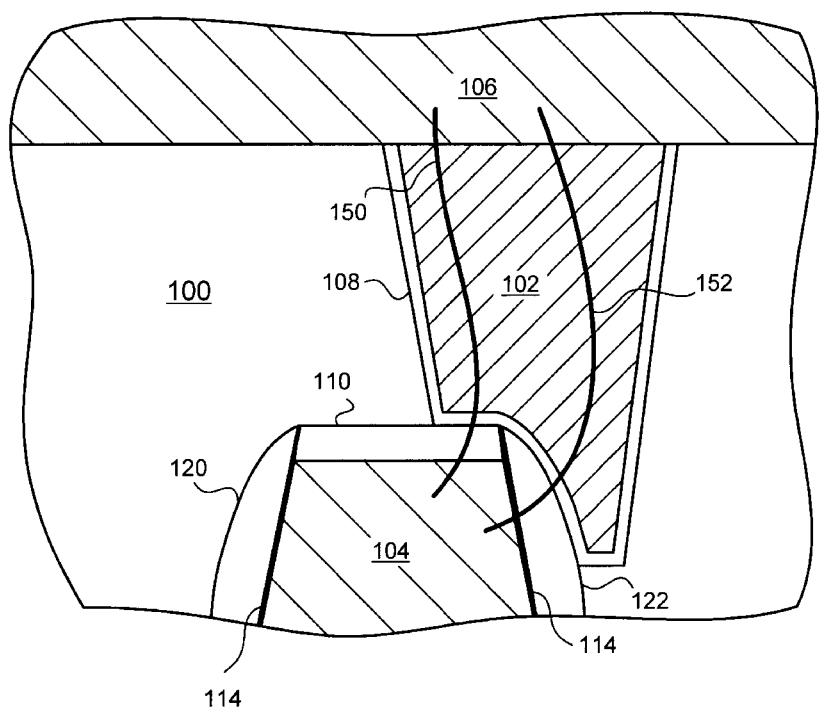
FIG. 1 is a cross-sectional side view of a connection line and an interconnect stud in accordance with a first embodiment of the present invention.

Turning now to FIG. 1, FIG. 1 is a cross sectional side view of a semiconductor portion 100 in accordance with a first embodiment of the present invention. The semiconductor portion 100 includes a interconnection stud 102 which connects between a first connection line 104 and a second connection line 106.

The first and second connection lines 104 and 106 generally comprise a metal with good conductivity, such as aluminum copper (AlCu) or another suitable conductor. Aluminum copper is generally chosen because of its good conductivity. It is also advantageous because AlCu is relatively easy to pattern using a reactive ion etch (RIE) or otherwise directional etch.

To form the first connection line 104, a layer of AlCu or other suitable material is deposited. Next a layer of Ti is deposited over the AlCu. A photoresist mask is deposited and patterned, and the wafer is then subjected to a reactive ion etch. The RIE etch removes the excess AlCu and Ti. This results in the AlCu connection line 104 and the titanium layer 110.

One side effect of the reactive ion etch is that a polymer film is formed on the sidewalls of the Ti/AlCu. This is caused by the degrading of the photoresist that occurs during reactive ion etching. The polymer films 114 have very poor conductivity and can electrically isolate the first connection line 104 from the interconnect stud where they connect.

In the first embodiment, illustrated in FIG. 1, sidewall spacers 120 and 122 are added to the first connection line 104 before the insulator is deposited. The sidewall spacers, and in particular, the sidewall spacer 122 provides an alternative conduction path between the first connection line 104 and the interconnect stud 102. In particular, the sidewall spacer 122 provides contact with the Ti/TiN layer 108 along its exterior side. In FIG. 1, current flow line 150 shows a direction of current flow from the first connection line 104 to the second connection line 106 along a direct low resistant route. Line 152 shown an example of a second path that is higher resistance but gets distributed in such a large area that the overall resistance of the path is low.

Figure 2:
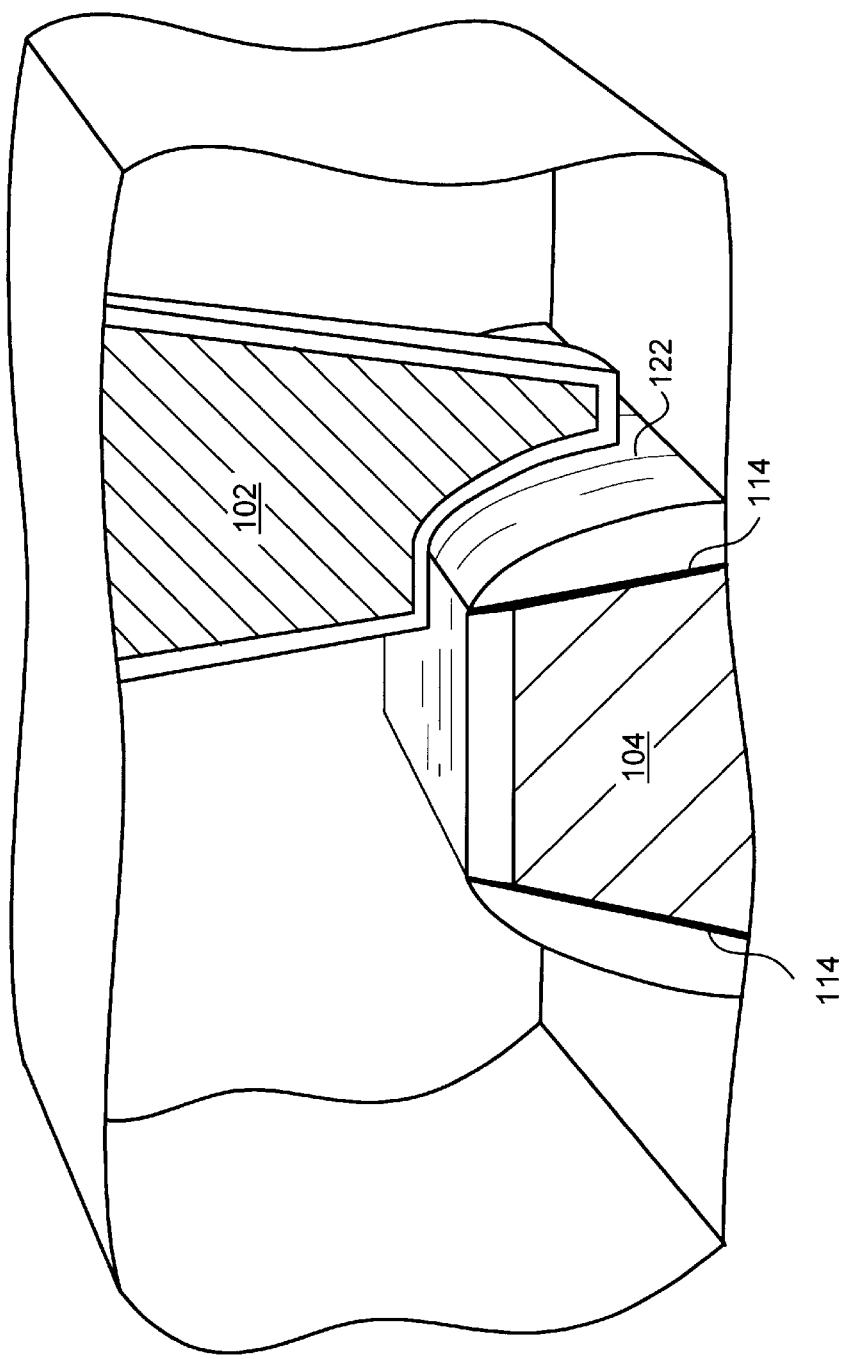
FIG. 2 is a cross-sectional perspective view of a connection line and an interconnect stud in accordance with the first embodiment of the present invention.

Turning to FIG. 2, a perspective view of the semiconductor portion is illustrated to show the increased conductive area The interconnect stud 102 is connected to the sidewall spacer 122 which in turn is connected to the first connection line 104. The sidewall spacer 122 is connected to the first connection line 104 along the entire sidewall of connection line 104. Current can flow from the first connection line 104 to the sidewall spacer 122 all along the sidewall of the first connection line 104. In particular, there is a large conductive area between first connection line 104 and sidewall spacer 122. The size of this conductive area negates the increase in resistance caused by polymer film 114. Thus, the use of the sidewall spacer 122 increases the conductivity of the connection between the first connection line 104 and the interconnect stud 102.

Returning to FIG. 1, before the tungsten is deposited for sidewall spacers 120 and 122, a deposition of titanium and titanium nitride is made over the wafer surface.

This Ti/TiN layer (not shown in FIG.) lowers the contact resistance to the connection line 104 and prevents etching of the connection line 104 by tungsten hexafluoride ($WF_6$) during the chemical vapor deposition of tungsten for the sidewall spacers 120 and 122. If the tungsten is deposited using another technique, such as physical vapor deposition (PVD) then the Ti/TiN layer is not required although it still offers increased conductivity.

The sidewall spacers 120 and 122 are then preferably formed by first depositing a conforming layer of tungsten over the surface of the wafer using CVD or PVD. The tungsten layer is then directionally etched in the vertical direction. This process leaves tungsten on the sidewalls of the first connection line 104 while removing the Ti/TiN and tungsten from the horizontal surfaces, and thus forms sidewall spacers 120 and 122. This process for forming the spacers 120 and 122 is preferable because it does not require additional masking steps.

The next step is to deposit dielectric material covering the first connection line 104. The dielectric material can comprise silicon dioxide or any other suitable material. Then the dielectric is planted by chemical mechanical polish (CMP).

The next step is to fabricate a hole in the dielectric hole in which the interconnect stud will be formed. This is generally done by a process called via etching, where photoresist is patterned and developed to form a etch mask. The dielectric is then subject to a reactive ion etch, which forms the interconnect stud hole. The reactive ion etch is selected to etch the dielectric much faster than it does titanium layer 110 or sidewall spacers 120 and 122.

After the hole has been fabricated in the dielectric, a titanium/titanium nitride (Ti/TiN) liner 108 is formed in the hole. The liner 108 is preferably sputter deposited, with or without a collimater, but other suitable methods can be used. Next, the core of the interconnection stud 102 is formed in the hole. This is preferably done by chemical vapor depositing a metal conductor, such as tungsten (W), into the hole such that the entire hole is filled. Of course, other suitable materials and formation methods can be used.

The device is then planarized using a chemical mechanical polish (CMP). The second connection line 106 is then formed in the same manner as the first connection line 104. Thus, the first and second connection lines 104 and 106 are connected together with a the interconnect stud 102. Such an interconnect stud is an example of an interlevel interconnect structure used to connect connection lines on one metal layer to another.

Thus, the first embodiment in FIG. 1 provides an improved conduction path between the interconnect stud and the connection line. The improved path is provided by providing a conduction path through the sidewall spacers and into the interconnect stud. This improvement is provided with out additionally masking steps or other excessive fabrication changes.

Figure 3:
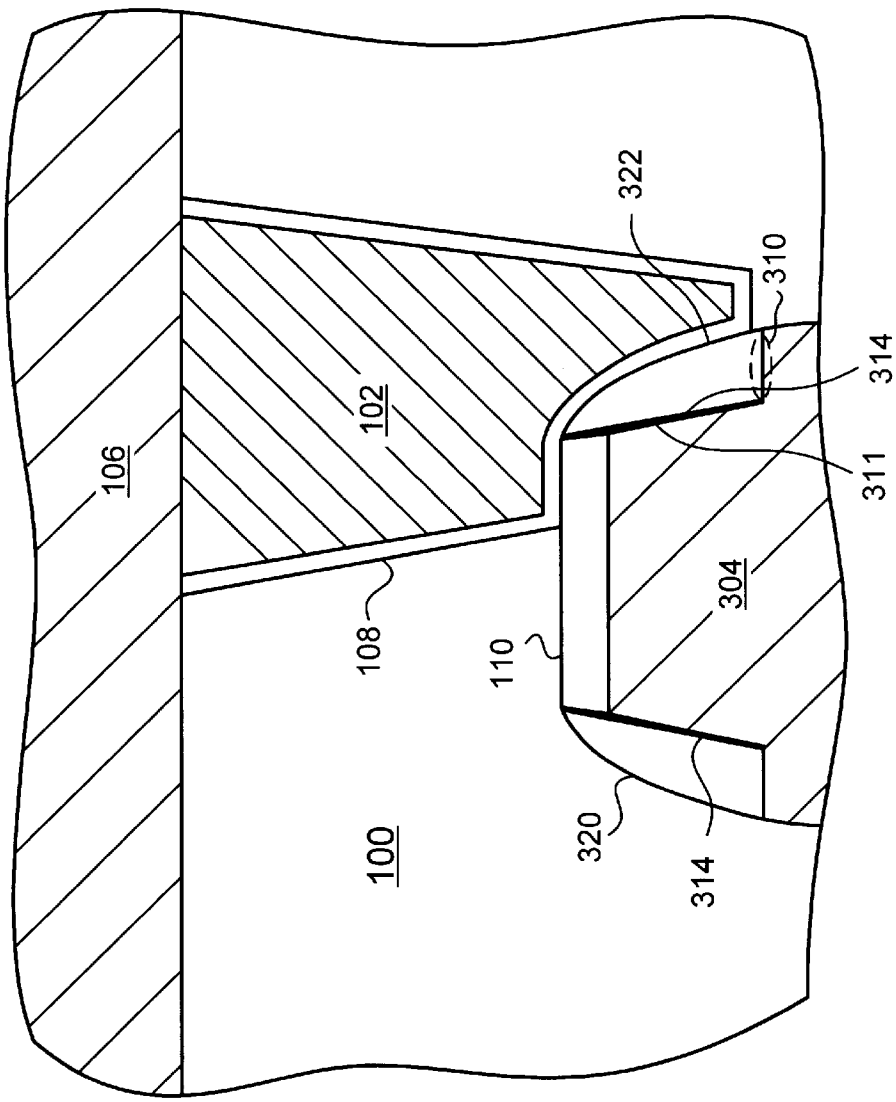
FIG. 3 is a cross-sectional side view of a connection line and an interconnect stud in accordance with a second embodiment of the present invention.

Turning now to FIG. 3, a second embodiment of the present invention is illustrated. In this embodiment, the first connection line is fabricated in the similar manner as the first embodiment. In particular, the first connection line is fabricated by first depositing a blanket of AlCu or other suitable material and a titanium layer over the AlCu. Photoresist is then deposited, exposed and developed, leaving patterns of photoresist on the blanket of AlCu. Reactive ion etch is then used to etch away the AlCu and titanium everywhere the photoresist is not.

In this second embodiment, the reactive ion etch is discontinued before the entire depth of AlCu is removed. Again the reactive ion etch has a side effect of forming a polymer film 314 on the sidewalls of the AlCu. These polymer films 314 (illustrated as dark lines) do not etch, and becomes a type of sidewall mask. While the polymer films are formed on the sidewalls of the AlCu, it is not formed on the horizontal surfaces of the AlCu. The reason for this is that the ion bombardment that occurs during the RIE etch comes down vertically, and prevents polymer build up on the horizontal surfaces.

A Ti/TiN layer (not shown in FIG.) is then preferably deposited to lowers the contact resistance to the connection line 304 and prevents etching of the connection line 304 by tungsten hexafluoride ($WF_6$) during the chemical vapor deposition of tungsten.

Sidewall spacers 320 and 322 are then formed by depositing a conforming layer of tungsten or other suitable material over the surface of the wafer. Again, this is preferably done using a CVD process. The Ti/TiN and tungsten layers are then directionally etched in the vertical direction, until only the sidewall spacers 320 and 322 remain.

A directional etch in the vertical direction is then started and continued until the tungsten/TiN/Ti/AlCu is removed from between the lines. The sidewall spacers 320 and 322 mask the AlCu beneath, and thus the directional etch process removes AlCu only from the areas not covered by the photoresist or the sidewall spacers 320 and 322. The process of etching the AlCu partially, forming sidewall spacers, and etching the remaining AlCu forms a first connection line 304 with a "step" extending out from each of the AlCu sidewalls.

Because there are no polymer films on the horizontal surfaces of the AlCu, the top surface of the first connection line step adds additional high-conductive area 310 between the sidewall spacer 322 and the first connection line 304. Furthermore, the sidewall spacer 322 is connected to the first connection line 304 along the sidewall 311 of connection line 304. As in the first embodiment, the polymer film 314 makes this a high resistance path but this is offset by the large size of the conductive area between sidewall spacer 322 and the first connection line 304.

Figure 4:
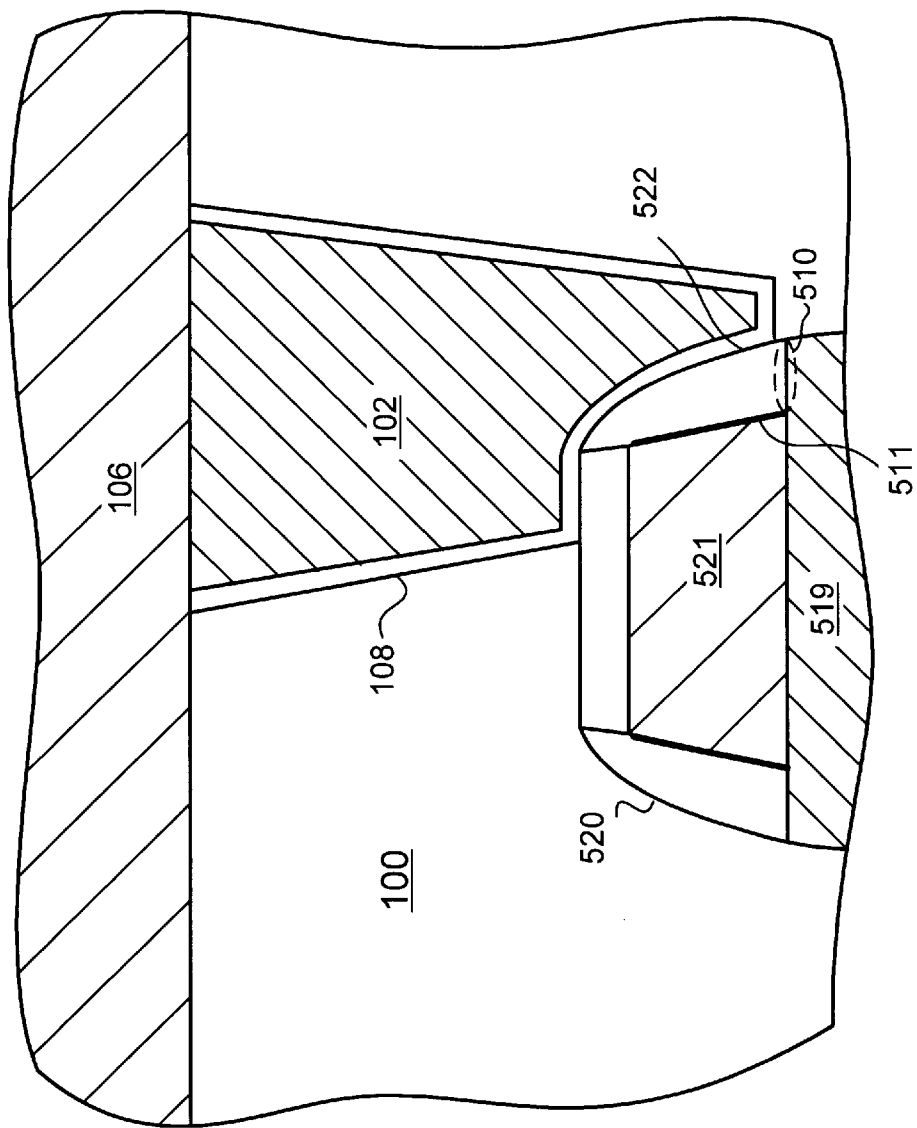
FIG. 4 is a cross-sectional side view of a connection line and an interconnect stud in accordance with a third embodiment of the present invention.
Figure 5:
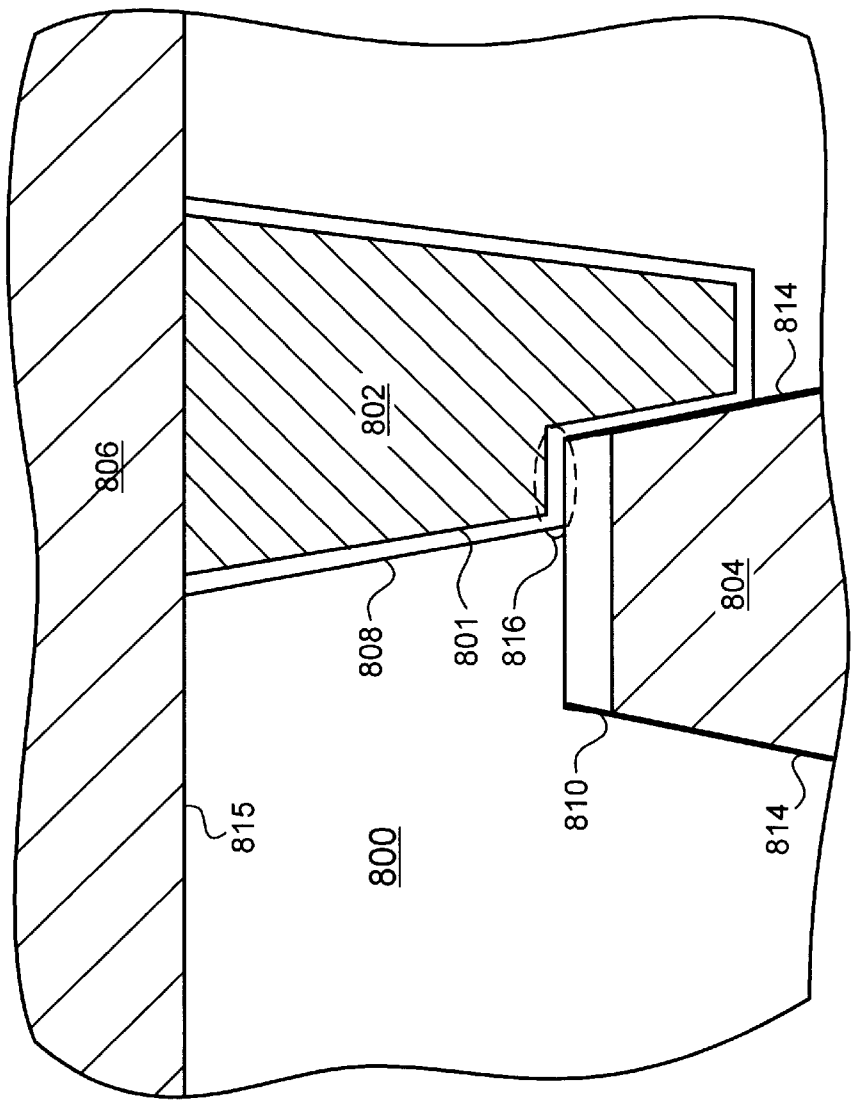
FIG. 5 is a cross-sectional side view of a prior art connection line and an interconnect stud.

Turning to FIG. 4, a third embodiment is illustrated. This embodiment is a modification of the second embodiment. In the third embodiment, the connection line is preferably formed by depositing a first layer 519 and then depositing a second layer 521. In the preferred embodiment, the connection line first layer 519 comprises titanium and the connection line second layer 521 comprises AlCu. The connection line is then patterned and etched as in the second embodiment, with the etching suspended at or near the top of the connection line first layer 519. Sidewall spacers 520 and 522 are then formed on the sidewalls of the connection line second layer 521 by conformal deposition and directional etch of a suitable material such as tungsten. A directional etch is then used again, with the result being a connection line that has a "step" in its sidewalls at the transition between the connection line first layer 519 and the connection line second layer 521.

Because there are no polymer films on the horizontal surfaces, the top surface of the connection line first layer at the "step" adds an additional high-conductive area 510 between the sidewall spacer 522 and the first connection line. Furthermore, the sidewall spacer 522 is connected to the first connection line 304 along the sidewall 511 of the connection line second layer 521. As in the first embodiment, the polymer film 314 makes this a high resistance path but this is offset by the large size of the conductive area between sidewall spacer 522 and the first connection line.

In a variation on the third embodiment, the connection line first layer 519 is instead formed as the top portion of an interconnect stud that is used to connect the first connection line to a connection line below it. In this variation, the top of the "step" occurs at the transition between the interconnect stud and the connection line second layer 521.

Each of the embodiments of the present invention provide improved conductivity between connection lines and vertical interconnect studs. This improvement is provided without requiring excessive processing steps or additional mask layers. The improved conductivity will allow the feature size to continue to shrink while maintaining sufficient contact.

While the invention has been particularly shown and described with reference to preferred exemplary embodiments thereof, it will be understood by those skilled in the art that variations in form and detail may be made therein without departing from the spirit and scope of the invention.

We claim:

1. A method for forming an interlevel interconnection in a semiconductor device, said method comprising the steps of:

a) forming a first level electrically conductive line on a substrate of the semiconductor device;

b) forming at least one conductive spacer on a side of the first level electrically conductive line;

c) forming an interconnect structure contacting at least a top portion of the first level electrically conductive line and at least a portion of the at least one conductive spacer such that said interlevel interconnect is electrically connected to said first level electrically conductive line through said top portion of said first level electrically conductive line and said at least one conductive spacer; and d) forming a second level conductive line in contact with at least a portion of the interconnect structure.

2. The method of claim 1 wherein the step of forming the first level conductive line comprises depositing a first metal layer comprising aluminum copper and a top layer comprising titanium on said aluminum copper.

3. The method of claim 2 wherein the step of forming the first level conductive line further comprises depositing photoresist, patterning said photoresist, and etching said aluminum copper and said titanium.

4. The method of claim 1 wherein the step of forming the first level conductive line comprises forming a step in a sidewall of the first level conductive line.

5. The method of claim 4 wherein the step of forming the first level conductive line comprises depositing a conductive material, depositing photoresist on said conductive material, patterning said photoresist, and etching said conductive material, said etching stopping before conductive material is etched completely through, thereby forming said step in the sidewall of the first level conductive line.

6. The method of claim 1 wherein the step of forming a sidewall spacer comprises conformally depositing a conductive material and directional etching said conductive material.

7. The method of claim 6 wherein said sidewall spacer comprises tungsten.

8. The method of claim 1 wherein the step of forming the first level conductive line comprises depositing a conductive material, depositing photoresist on said conductive material, patterning said photoresist, and etching said conductive material, said etching stopping before conductive material is etched completely through, thereby forming said step in the sidewall of the first level conductive line and wherein the step of forming a sidewall spacer comprises conformally depositing a spacer conductive material and directional etching said spacer conductive material.

9. The method of claim 1 wherein the step of forming the first level conductive line comprises depositing a layer of first conductive material and a layer of second conductive material atop said first conductive material, depositing photoresist on said second conductive material, patterning said photoresist, and etching said second conductive material, said etching stopping before said first conductive material is etched completely through, thereby forming a step in the sidewall of the first level conductive line and wherein the step of forming a sidewall spacer comprises conformally depositing a spacer conductive material and directional etching said spacer conductive material.

10. The method of claim 9 wherein the first conductive material comprises titanium, the second conductive material comprises aluminum copper and the spacer conductive material comprises tungsten.

11. The method of claim 1 wherein the interconnect structure comprises a tungsten stud.

12. The method of claim 1 wherein the step of forming a first level electrically conductive line comprises forming said first level electrically conductive line atop a lower interconnect stud, and wherein a step having a top surface is formed at said first level electrically conductive line interface with said lower interconnect stud, and wherein the step of forming at least one conductive spacer comprises forming a spacer that contacts said step top surface.

13. A method for forming an interlevel interconnection in a semiconductor device, said method comprising the steps of:

a) forming a first level electrically conductive line on a substrate of the semiconductor device by depositing at least one conductive material, depositing photoresist on said conductive material, patterning said photoresist, and etching said conductive material, said etching stopping before said conductive material is etched completely through, thereby forming said step in the sidewall of the first level conductive line;

b) forming at least one conductive spacer on a side of the first level electrically conductive line by conformally depositing a spacer conductive material and directional etching said spacer conductive material;

c) forming an interlevel interconnect structure contacting at least a portion of the first level electrically conductive line and at least a portion of the at least one conductive spacer such that said interlevel interconnect is electrically connected to said first level electrically conductive line through said top portion of said first level electrically conductive line and said at least one conductive spacer; and d) forming a second level conductive line in contact with at least a portion of the interlevel interconnect structure.

* * * * *